United States Patent
Baglin et al.

(10) Patent No.: US 6,657,909 B2
(45) Date of Patent: Dec. 2, 2003

(54) MEMORY SENSE AMPLIFIER

(75) Inventors: Thomas Jean Ludovic Baglin, Mougins le Haut (FR); Jean-Yves Michel Larguier, Antibes (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/030,288

(22) PCT Filed: Apr. 27, 2001

(86) PCT No.: PCT/EP01/04797
§ 371 (c)(1),
(2), (4) Date: Jul. 31, 2002

(87) PCT Pub. No.: WO01/86658
PCT Pub. Date: Nov. 15, 2001

(65) Prior Publication Data
US 2003/0063496 A1 Apr. 3, 2003

(30) Foreign Application Priority Data
May 8, 2000 (DE) .......................... 100 22 263

(51) Int. Cl.[7] ............................................... G11C 7/00
(52) U.S. Cl. ...................................... 365/205; 365/203
(58) Field of Search ................................ 365/203, 205

(56) References Cited

U.S. PATENT DOCUMENTS

| | | | |
|---|---|---|---|
| 5,615,161 A | 3/1997 | Mu | 365/208 |
| 5,982,202 A | 11/1999 | Peak, Jr. | 327/55 |
| 6,374,393 B1 * | 4/2002 | Hirairi | 716/8 |
| 6,438,035 B2 * | 8/2002 | Yamamoto et al. | 365/185.21 |

OTHER PUBLICATIONS

Takahashi et al., "Gate Arrays," IEEE International Solid–State Circuits Conference, p. 178–179, 332, (Feb. 2, 1989).

Tietze et al., "Schaltungstechnische Realisierng der Grundfunktionen," Halbleiter–Schaltungstechnik, p. 642–649.

* cited by examiner

*Primary Examiner*—M. Tran
(74) *Attorney, Agent, or Firm*—Jenkins, Wilson & Taylor, P.A.

(57) ABSTRACT

Memory sense amplifier unit for amplifying a data signal read from a memory via bit lines (2, 3), having a precharge circuit (4) comprising PMOS transistors (5, 6) and serving for rapidly precharging the bit lines (2, 3) to a supply voltage potential ($V_{DD}$) of the sense amplifier unit (1); a first amplifier stage (43) comprising feedback NMOS transistors (21, 22, 24, 26) and serving for voltage level shifting and for amplifying the data signal present on the bit lines (2, 3); and having a second amplifier stage (66) for amplifying further the signal output by the first amplifier stage (43), in which case the first amplifier stage (43) can be initialized to the supply voltage potential ($V_{DD}$) and the second amplifier stage (43) can be initialized to ground potential ($V_{SS}$).

12 Claims, 2 Drawing Sheets

MEMORY SENSE AMPLIFIER

TECHNICAL FIELD

The invention relates to a memory sense amplifier for amplifying a data signal read from a memory cell matrix.

BACKGROUND ART

Semiconductor memories are binary data memories having a semiconductor memory cell matrix in which the individual memory cells are arranged in matrix form and comprise the semiconductor components. In this case, the individual memory cells are connected to word lines and to bit lines running perpendicularly thereto. The addressing, i.e. the selection of a memory cell or of a memory word is effected by the activation of the word lines and, in the case of a bit selection, by selection of one of the bit lines BL. The addressing is effected via an address decoder which generates selection signals for word line and/or bit line selection in a manner dependent on an address signal present on an address bus. The data signals read out are read out via a sense amplifier which amplifies the data signal read out.

FIG. 1 shows the basic construction of a semiconductor memory having a memory cell matrix which is addressed via an address decoding circuit and which outputs read-out data signals to a sense amplifier integrated in the semiconductor memory. The sense amplifier comprises a plurality of sense amplifier units which each amplify a data signal present on a bit line BL.

FIG. 2 shows a sense amplifier unit according to the prior art.

In the reading operating mode, the voltage which is present on the bit line BL and the bit line $\overline{BL}$ complementary thereto and forms the data signal that is read from the memory is amplified by a differential amplifier circuit and is output at the signal output OUT. In this case, the differential amplifier is constructed symmetrically and comprises two PMOS transistors P1, P2 and also two NMOS transistors N2, N3. The differential amplifier is activated by the application of a control signal S, which turns on the NMOS transistor N4.

After the read operation, the bit lines BL and $\overline{BL}$ must be charged again uniformly. This is done by the two NMOS transistors N0, N1, the PMOS transistor P0 connected in parallel therewith being turned on and equalizing the voltage potential built up in each case on the bit lines BL, $\overline{BL}$.

The voltage $V_{BL}$ to which the bit lines are charged via the two NMOS transistors N0 and N1 is:

$$V_{BL}=V_{DD}-V_{THN} \quad (1)$$

where $V_{DD}$ is the supply voltage and $V_{THN}$ is the threshold voltage of the NMOS transistors N0, N1 at a source-substrate voltage of 0 volts.

On account of the substrate effect or body effect, the threshold voltage of a MOSFET transistor depends on the source-substrate voltage.

$$V_{TH}=V_{TH0}+\beta *V_{SB} \quad (2)$$

where $\beta$ is a technology-dependent constant and $V_{SB}$ denotes the voltage between the source terminal and the substrate terminal (bulk).

The charging current I depends on the voltage difference between the gate-source voltage $V_{gs}$ and the threshold voltage $V_{TH}$.

$$I=K*(V_{gs}-V_{TH}) \quad (3)$$

where K denotes a constant which is dependent on the fabrication technology and the dimensions of the MOSFET transistor.

The substrate voltage $V_B$ and also the source voltage $V_S$ are usually zero volts, so that the difference voltage $V_{SB}$ is likewise zero volts and the substrate effect is not manifested. As soon as a voltage difference that deviates from zero occurs between the source and the substrate terminal $V_{SB}$, the threshold voltage $V_{TH}$ increases and the charging current I decreases. At the same time, the charging voltage $V_{BL}$ applied to the bit line decreases.

$$V_{BL}=V_{DD}-V_{TH0}-\beta *V_{SB} \quad (4)$$

If the voltage $V_S$ present at the source terminals of the two NMOS transistors N0, N1 reaches the charging voltage value $V_{BL}=V_{DD}-V_{TH}$, the current flowing through the NMOS transistor is approximately:

$$I=K_1(V_{DD}-V_{TH}-V_3)^2 \quad (5)$$

The negative consequences of the substrate effect are amplified the higher the degree of miniaturization of the fabrication technology. The threshold voltage deviation increases greatly in particular in the case of fabrication technologies with dimensions far smaller than 1 $\mu$m, i.e. 0.25 $\mu$m, 0.18 $\mu$m or less. Since the technology-dictated constant $\beta$ cannot be set exactly, the precharge voltage $V_{BL}$ occurring on the bit line BL likewise fluctuates to a great extent. It is not possible, therefore, to ensure a predefined precharge voltage on the bit lines.

A further disadvantage of the precharge circuits comprising the NMOS transistors N0, N1 and serving for charging the bit lines BL, $\overline{BL}$ of the conventional memory sense amplifier unit illustrated in FIG. 2 is that the charging time required for charging the bit lines is relatively long on account of the substrate effect. Since a charging operation of the bit lines BL, $\overline{BL}$ is necessary between every reading and writing operation for reading data from the memory and for writing data to the memory, overall the memory access time is considerably increased as a result of this.

SUMMARY OF THE INVENTION

The object of the present invention, therefore, is to provide a memory sense amplifier unit which ensures a minimal charging time for charging the bit lines to a specific voltage potential.

This object is achieved according to the invention by means of a memory sense amplifier unit having the features specified in patent claim 1.

The invention provides a memory sense amplifier unit for amplifying a data signal read from a memory via bit lines, having a precharge circuit comprising PMOS transistors and serving for rapidly precharging the bit lines to the supply voltage potential of the memory sense amplifier unit, a first amplifier stage comprising feedback NMOS transistors and serving for voltage level shifting and for amplifying the data signal present on the bit lines; and having a second amplifier stage for amplifying further the signal output by the first amplifier stage, in which case the first amplifier stage (43) can be initialized to the supply voltage potential ($V_{DD}$) and the second amplifier stage (43) can be initialized to ground potential ($V_{SS}$).

One advantage of the memory sense amplifier unit according to the invention is that it compensates for the substrate effect. Consequently, the memory sense amplifier unit according to the invention is suitable in particular for fabrication technologies with structural dimensions smaller than 1 μm.

A further advantage of the memory sense amplifier unit according to the invention is that it functions even at a relatively low supply voltage.

In a preferred embodiment of the memory sense amplifier unit according to the invention, the precharge circuit switches the supply voltage potential through directly, without a voltage drop, to the bit lines, in a manner dependent on a first operating mode control signal present at the gate terminals of the PMOS transistors.

The first amplifier stage preferably shifts the voltage potential present on the bit lines by a constant voltage value.

The first amplifier stage preferably comprises four feedback NMOS transistors.

The second amplifier stage is preferably a differential amplifier stage comprising two PMOS transistors and two NMOS transistors.

In a preferred embodiment, the sense amplifier unit according to the invention can be changed over between a precharge operating mode, a writing operating mode and a reading operating mode by two operating mode control signals.

In this case, in the precharge operating mode, the sense amplifier unit is preferably initialized for a subsequent read/write operation.

In a preferred embodiment of the sense amplifier unit according to the invention, the second amplifier stage can be connected to ground by means of an NMOS transistor, the NMOS transistor being controlled by the second operating mode control signal.

This NMOS transistor is used for activating and deactivating the second amplifier stage in order to reduce the energy consumption when the reading operation is not being performed.

In a further preferred embodiment of the sense amplifier unit according to the invention, the gate terminals of the two PMOS transistors of the second amplifier stage can be connected to a ground potential by means of pull-down transistors which are driven by the inverted second operating mode control signal.

The supply voltage is preferably connected to the first amplifier stage by means of a PMOS transistor, the PMOS transistor being driven by the inverted second operating mode control signal.

In a particularly preferred embodiment, the memory sense amplifier unit is constructed using CMOS technology.

BRIEF DESCRIPTION OF THE DRAWINGS

A preferred embodiment of the memory sense amplifier unit according to the invention, is described below with reference to the accompanying figures in order to elucidate features that are essential to the invention.

In the figures.

DETAILED DESCRIPTION OF THE INVENTION

Figure 1:
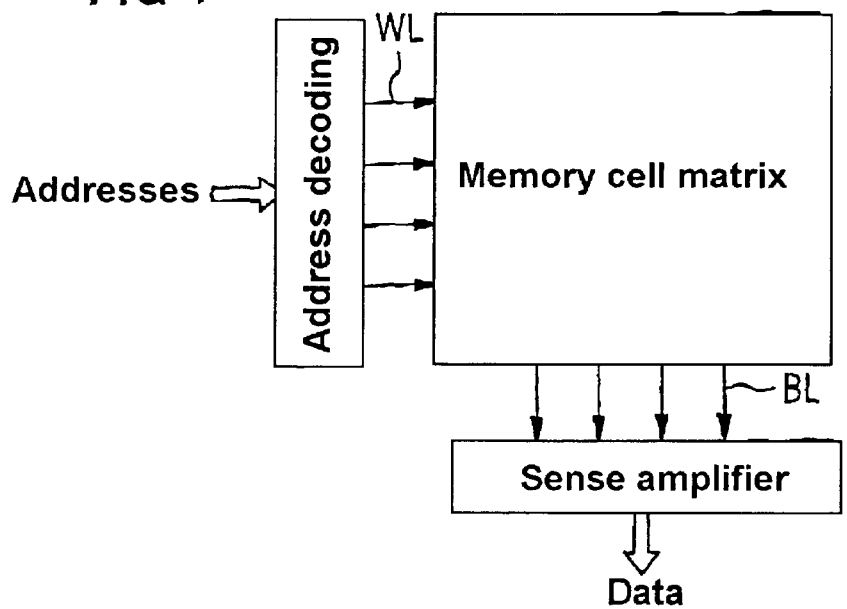
FIG. 1 shows the basic construction of a semiconductor memory with a sense amplifier for reading out the data stored in the memory, according to the prior art.
Figure 2:
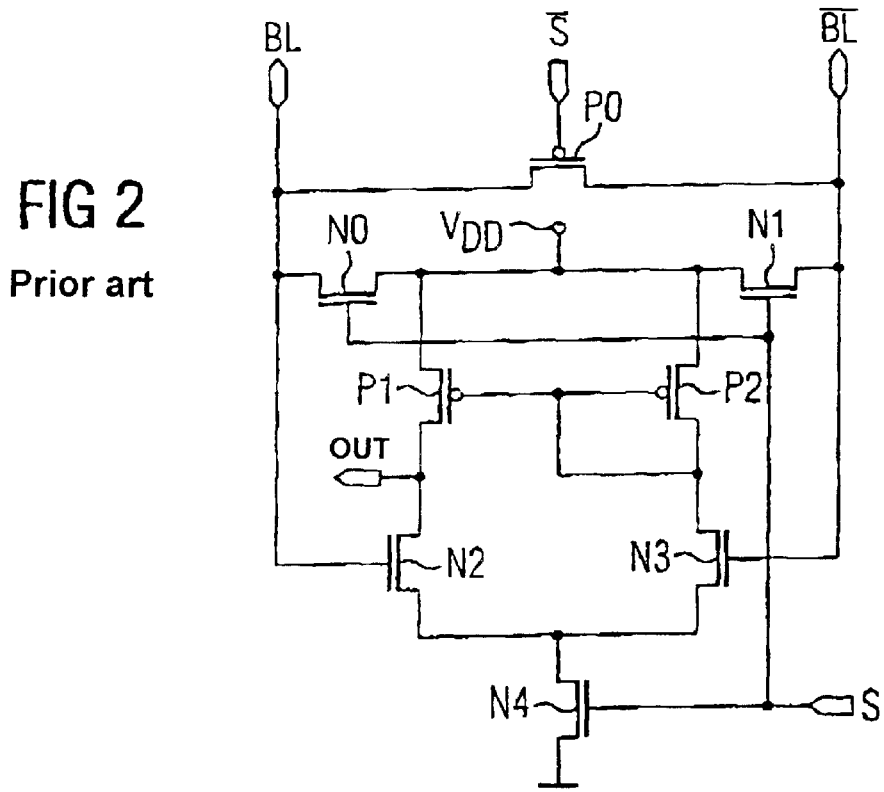
FIG. 2 shows a memory sense amplifier unit for amplifying a data signal read from the semiconductor memory, according to the prior art.
Figure 3:
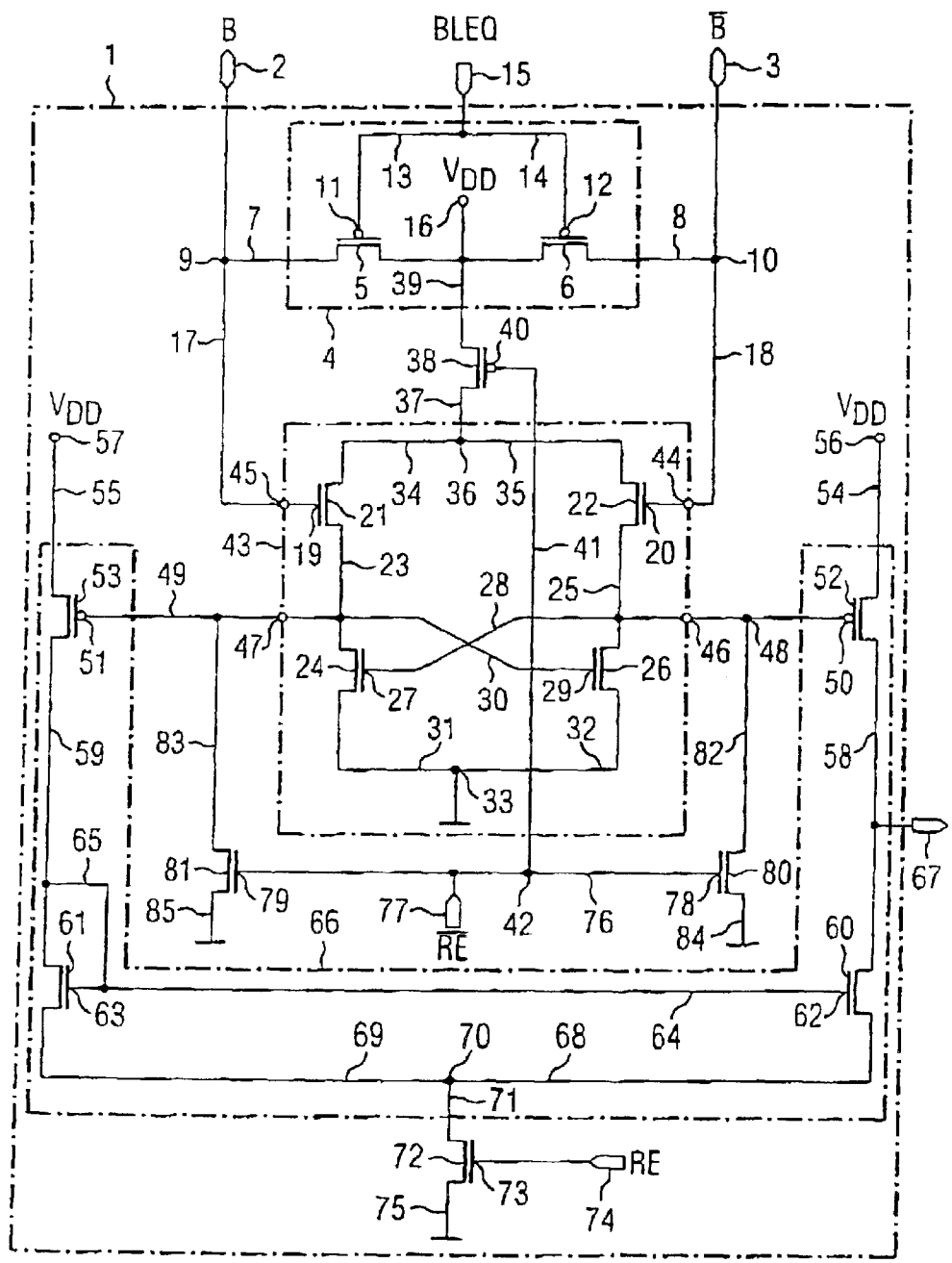
FIG. 3 shows a preferred embodiment of the memory sense amplifier unit according to the invention.

FIG. 3 shows a particularly preferred embodiment of the memory sense amplifier unit according to the invention for amplifying a data signal read from a semiconductor memory via bit lines.

The memory sense amplifier unit 1 according to the invention is connected to the semiconductor memory via bit lines 2, 3. The data signal to be amplified is present on the bit line 2 and the inverted data signal with respect thereto is present on the bit line 3. A precharge circuit 4 comprising two PMOS transistors 5, 6 is connected to the bit lines 2, 3 via lines 7, 8 at nodes 9, 10. The gate terminals 11, 12 of the two PMOS transistors 5, 6 are connected via control lines 13, 14 to a control signal terminal line 15 for applying a first operating mode control signal. The precharge circuit 4 is connected to the supply voltage $V_{DD}$ of the memory sense amplifier unit 1 via a supply voltage terminal 16.

The nodes 9, 10 present on the bit lines 2, 3 are connected to gate terminals 19, 20 of NMOS transistors 21, 22 via internal lines 17, 18. The NMOS transistor 21 is connected in series with a further NMOS transistor 24 via a line 23. The NMOS transistor 22 is likewise connected in series with a further NMOS transistor 26 via a line 25. The gate terminal 27 of the NMOS transistor 24 is connected to the line 25 via a feedback line 28 and the gate terminal 29 of the NMOS transistor 26 is connected to the line 23 via a feedback line 30.

The NMOS transistors 24, 26 are connected via lines 31, 32 to a node 33 for connection to a reference potential. The reference potential is preferably the ground potential. The NMOS transistors 21, 22 are connected via lines 34, 35 to a node 36, to which a PMOS transistor 38 is connected via a line 37, via which transistor the supply voltage $V_{DD}$ present at the supply voltage terminal 16 can be switched through to the line 37 by means of a line 39. The switching PMOS transistor 38 has a control gate 40, which is connected to a node 42 via a control line 41.

The NMOS transistors 21, 22, 24, 26 form the first amplifier stage 43 of the memory sense amplifier 1. The first amplifier stage 43 has two input terminals 44, 45, which are connected to the bit lines 2, 3 via the lines 17, 18, and also two output terminals 46, 47 for outputting the amplified difference signal.

The output terminals 46, 47 of the first amplifier stage 43 are connected to gate terminals 50, 51 of two PMOS transistors 52, 53 via lines 48, 49. The two PMOS transistors are respectively connected via lines 54, 55 to supply voltage terminals 56, 57. The PMOS transistors 52, 53 are furthermore connected in series with NMOS transistors 60, 61 via lines 58, 59. The gate terminals 62, 63 of the two NMOS transistors 60, 61 are short-circuited to one another via a line 64. The line 64 is directly connected to the line 59 via a line 65.

The two PMOS transistors 52, 53 and the NMOS transistors 60, 61 connected in series therewith form a symmetrically constructed second amplifier stage 66 for amplifying further the signal output by the first amplifier stage 43. The second amplifier stage 66 is a differential amplifier stage for amplifying the voltage difference between the output terminals 46, 47 of the first differential amplifier stage 43. The second amplifier stage 66 outputs the amplified signal via a signal output 67 of the memory sense amplifier unit 1. The NMOS transistors 60, 61 of the second amplifier stage 66 are connected via lines 68, 69 to a node 70, which is connected via a line 71 to an NMOS transistor 72, whose gate terminal 73 is connected to an operating mode control signal line 74. In this case, the NMOS transistor 72 is connected via a line 75 to a reference potential, which is preferably a ground potential. The NMOS transistor 72 serves for switching the second amplifier stage 66.

The PMOS transistor 38 for connecting the supply voltage $V_{DD}$ to the first amplifier stage 43 is connected via the line 41 and the node 42 to a control signal line 76, which is connected to an operating mode control signal terminal 77.

The control signal line 76 lies between the gate terminals 78, 79 of two pull-down NMOS transistors 80, 81. The pull-down NMOS transistors 80, 81 are connected via lines 82, 83 to the connecting lines 48, 49 between the first amplifier stage 43 and the second amplifier stage 66. The pull-down NMOS transistors 80, 81 are connected to the reference potential via lines 84, 85. In this case, the reference potential is preferably the ground potential.

The sense amplifier unit 1 can be changed over between a precharge operating mode, a writing operating mode and a reading operating mode via the operating mode control terminals 15, 74, 77. For this purpose, a read enable signal RE is applied to the control terminal 74, the inverted control signal $\overline{RE}$ with respect thereto is applied to the control terminal 77, and a bit line equalization signal BLEQ is applied to the control terminal 15.

The three different operating modes are selected as follows:

TABLE 1

| Operating mode | BLEQ | RE |
|---|---|---|
| Precharge | 0 | 0 |
| Reading | $V_{DD}$ | $V_{DD}$ |
| Writing | $V_{DD}$ | 0 |

In the precharge operating mode, the bit line equalization control terminal 15 and the read enable control terminal 74 are at ground potential and the control terminal 77 is at supply voltage potential $V_{DD}$. The control signal BLEQ turns on the transistors 5, 6 of the precharge circuit 4, with the result that the bit lines 2, 3 are charged to the supply voltage potential $V_{DD}$ present at the terminal 16. The high-level control signal $\overline{RE}$ present at the control signal terminal 77 switches off the PMOS transistor 38 and simultaneously switches on the pull-down NMOS transistors 80, 81. Since the PMOS transistor 38 is turned off, the first amplifier stage 43 receives no supply voltage $V_{DD}$ during the charging operation. The turned-on pull-down NMOS transistors 80, 81 pull the output terminals 46, 47 of the first amplifier stage 43 to ground, so that a different voltage which can be amplified by the second amplifier stage 66 is not present at the output of the first amplifier stage 43.

The control signal RE at the control signal terminal 74 is at a low level in the precharge operating mode, with the result that the NMOS transistor 72 turns off. The current path from the second amplifier stage 66 to the ground terminal is interrupted as a result of this. Since the output terminals 46, 47 of the first amplifier stage 43 are pulled to ground by the NMOS pull-down transistors 80, 81, the PMOS transistors 52, 53 of the second amplifier stage 66 are turned on, with the result that the supply voltage present at the supply voltage terminals 56, 57 is switched through to the lines 58, 59. Consequently, a high voltage potential $V_{DD}$ is output at the output terminal 67 of the sense amplifier unit 1 during the precharge operation of the bit lines 2, 3.

The precharge operating mode has a dual function.

While in the precharge operating mode the bit lines 2, 3 are uniformly charged to the supply voltage $V_{DD}$ and, at the same time, all the node voltages are reinitialized for the next read operation in the sense amplifier unit 1. In this case, the first amplifier stage 43 is initialized to the supply voltage $V_{DD}$ and the second amplifier stage 66 is initialized to ground voltage potential $V_{SS}$. The bit lines 2, 3 are charged to the supply voltage $V_{DD}$ by the PMOS transistors 5, 6 of the precharge circuit 4. If the drain voltage $V_D$ at the two PMOS transistors 5, 6 is virtually equal to the precharge voltage, the current through the respective PMOS transistor 5, 6 is equal to:

$$1 = K_2(V_{DD} - V_D) \quad (6)$$

The bit lines 2, 3 are charged to the supply voltage $V_{DD}$ significantly more rapidly in comparison with NMOS transistors. When NMOS transistors are used within the precharge circuit, the bit lines are charged to a charging voltage of $$V_{BL} = V_{DD} - V_{THN} \quad (7)$$

and the charging voltage when using the PMOS transistors 5, 6 is:

$$V_{BL} = V_{DD} \quad (8)$$

As a result of this, the voltage difference is increased during a read operation. PMOS transistors are better suited than NMOS transistors to charging a bit line to the supply voltage if the bit line value is in the region of the ideal precharge value, i.e. $V_{DD}$ in the case of PMOS precharging and $V_{DD} - V_{THN}$ in the case of NMOS precharging. The reason for this is the operating range of the charging transistor. The PMOS transistors are in the ohmic operating range (see equation (6)), whereas the NMOS transistors are in a saturated operating range (see equation (5)), which is ineffectual for charging.

When the bit lines 2, 3 are charged to the supply voltage $V_{DD}$, the current of the memory cell situated in the memory matrix is higher than when the bit lines are charged to $V_{DD} - V_{THN}$. This facilitates the reading operation for the sense amplifier.

In the writing operating mode, a high voltage potential $V_{DD}$ is applied to the bit line equalization control terminal 15, while a logic low is applied to the read enable control terminal 74. The high-level bit line output signal at the control terminal 15 turns off the two PMOS transistors 5, 6 of the precharge circuit 4. In the writing operating mode, the bit lines 2, 3 are written to, in a write operation, from a writing buffer integrated within the semiconductor memory, without resulting in an interaction with the memory sense amplifier unit 1.

In the read operating mode, a logic high-level control signal $V_{DD}$ is in each case applied to the bit line equalization control terminal 15 and to the read enable control terminal 74. The inverted read enable control signal $\overline{RE}$ is applied to the control terminal 77. The high-level bit line equalization control signal BLEQ turns off the two PMOS transistors 5, 6 of the precharge circuit 4. In a manner dependent on the data signal stored in the addressed memory cell, the addressed memory cell then attempts to pull the bit line 2 to ground and to leave the bit line 3 at supply voltage potential $V_{DD}$ or, conversely, to pull the bit line 3 to ground and to leave the bit line 2 at supply voltage potential $V_{DD}$. Since the capacitance of the bit lines 2, 3 may be relatively large in comparison with the driver capability of the addressed memory cell, the voltage difference between the two bit lines 2, 3 at the end of the read operation is relatively small and amounts, for example, to 100 mV.

The low-level inverted enable control signal $\overline{RE}$ at the control terminal 77 turns off the two pull-down NMOS transistors 80, 81 and simultaneously turns on the PMOS transistor 38 via the control line 41. As a result, the voltage potential at the node 36 rises to the supply voltage potential $V_{DD}$ present at the node 16. As a result, the NMOS transistors 21, 22, 24, 26 of the first amplifier stage 43 are transferred to the saturated operating range. By way of example, if the bit line 3 remains at the supply voltage potential $V_{DD}$ and the voltage potential of the bit line 2 decreases to a lower voltage $V_{DD}-\Delta V$ on account of the data signal read out, the current flowing through the NMOS transistor 24 remains constant, since said current depends only on the voltage potential at the node 46. In this way, the current flowing through the NMOS transistor 21 remains constant during the voltage drop on the bit line 2. The threshold voltage $V_{TH-21}$ of the NMOS transistor 21 depends on the source voltage of the NMOS transistor 21 on account of the substrate effect. This dependence can be specified to an approximation for the two NMOS transistors 21, 22 by the following equations:

$$V_{TH-21} = V_{THN} + \beta V_{47} \quad (9a)$$

$$V_{TH-22} = V_{THN} + \beta V_{46} \quad (9b)$$

where $\beta$ is a technology-dependent constant and $V_{46}$, $V_{47}$ are the voltage potential at the nodes 46, 47.

The current flowing through the NMOS transistor 21 can be specified to an approximation by the following equation:

$$I_{21} = K_N \cdot \frac{W_{21}}{L_{21}} [V_2 - (1+\beta)V_{47} - V_{THN}]^2 \quad (10)$$

where $W_{21}$ is the width of the NMOS transistor 21, and $L_{21}$ is the length of the NMOS transistor 21, $V_2$ is the voltage on the bit line 2, $V_{47}$ is the voltage at the potential node 47, and $K_N$ is a constant.

This current $I_{21}$, remains constant, with the result that the voltage present at the potential node 47 falls from an original voltage potential $V_{470}$ to a voltage potential $V_{470}-\Delta V/(1+\beta)$. Since the voltage $V_{47}$ at the potential node 47 is also the gate/source voltage of the NMOS transistor 26, the current through the NMOS transistor likewise decreases. This results in a mismatch between the current flowing through the NMOS transistor 22 and the current flowing through the NMOS transistor 26, this mismatch being compensated by a rise in the voltage at the potential node 46. Since the same current flows through the NMOS transistor 22 and the NMOS transistor 26 after the voltage has risen at the potential node 46, the following holds true:

$$K_N \cdot \frac{W_{26}}{L_{26}}(V_{47}-V_{THN})^2 = K_N \cdot \frac{W_{22}}{L_{22}}[V_3-(1+\beta)V_{46}-V_{THN}]^2 \quad (11)$$

With:

$$\alpha = \sqrt{\frac{W_{26}/L_{26}}{W_{22}/L_{22}}} \quad (12)$$

This means that a voltage drop of $\Delta V/(1+\beta)$ in the voltage $V_{47}$ leads to a voltage rise of $\Delta V = \alpha/(1+\beta)^2$ in the voltage $V_{46}$. This rise in the voltage $V_{46}$ at the potential node 46 leads, for its part, to a voltage drop $\Delta V = \alpha^2/(1+\beta)^3$ at the potential node 47, which, for its part, brings about a voltage rise at the node 46. This continues infinitely, in principle.

The voltage potentials at the potential node 46 and the potential node 47 can therefore be represented mathematically as infinite sums, as follows:

$$V_{46} = V_{46-0} + \frac{\Delta V}{1+\beta} \sum_{i=0}^{+\infty} \left(\frac{\alpha}{1+\beta}\right)^{2*i+1} \quad (13)$$

$$V_{47} = V_{47-0} - \frac{\Delta V}{1+\beta} \sum_{i=0}^{+\infty} \left(\frac{\alpha}{1+\beta}\right)^{2-i} \quad (14)$$

For $\alpha < 1+\beta$, the gain of the first amplifier stage 43 is finite and can be expressed by the following equation:

$$\frac{V_{46}-V_{47}}{\Delta V} = \frac{1}{1+\beta} \sum_{i=0}^{+\infty} \left\{\frac{\alpha}{1+\beta}\right\}^i = \frac{1}{1+\beta} \cdot \frac{1}{1-\alpha \frac{1}{1+\beta}} = \frac{1}{1+\beta-\alpha} \quad (15)$$

For $\beta < \alpha < 1+\beta$, the gain of the first amplifier stage 43 is thus greater than 1. Consequently, the feedback stage of the NMOS transistors 21, 22, 24, 26 via the feedback lines 28, 30 has the effect that the voltage gain of the first amplifier stage is greater than 1 and, consequently, the substrate effect occurring at the NMOS transistors is compensated.

In the reading operating mode, the read enable control signal RE at the control terminal 74 is applied to a logic high potential $V_{DD}$ and the NMOS transistor 73 is thus turned on. If it is assumed that the voltage on the bit line 3 remains at the original voltage potential $V_{DD}$, while the voltage on the bit line 2 decreases, the voltage potential at the node 47 decreases, as a result of which the gate/source voltage at the PMOS transistor 51 increases. This leads to the rise in the current flowing through the PMOS transistor 53, this current rise being mirrored by the current mirror circuit comprising the NMOS transistors 60, 61. The voltage potential at the output terminal 67 accordingly decreases in order that the current flowing through the MOSFET transistors 52, 60 has the same magnitude. The voltage drop at the output terminal 67 depends on the size of the PMOS transistors 52, 53 and the NMOS transistors 60, 61. The second amplifier stage 66 amplifies the voltage difference present between the potential nodes 46, 47 and outputs the amplified voltage difference at the output terminal 67 of the sense amplifier unit 1.

The sense amplifier unit 1 according to the invention is suitable in particular for an SRAM memory (SRAM: Static random access memory) constructed using CMOS technology.

In particular in the case of particularly small component dimensions lying below 1 $\mu$m, the memory sense amplifying unit 1 according to the invention compensates for parasitic effects, in particular the substrate effect, which become ever more pronounced as the power supply voltage $V_{DD}$ decreases and MOSFET channel lengths become shorter.

Furthermore, the sense amplifier unit 1 according to the invention is distinguished by a high degree of robustness relative to fluctuations in the case of control signal time sequences, temperature, fabrication process conditions and also the voltage supply.

Since the circuit complexity of the sense amplifier unit 1 according to the invention and the number of MOSFET transistors contained therein is low, the area requirements of the sense amplifying unit 1 according to the invention in the case of integration on a semiconductor chip is small. This enables the sense amplifier 1 to be constructed cost-effectively from a multiplicity of sense amplifier units 1 according to the invention.

What is claimed is:

1. A memory sense amplifier unit for amplifying a data signal read from a memory via bit lines, having:
   (a) a precharge circuit comprising PMOS transistors and serving for rapidly precharging the bit lines to a supply voltage potential ($V_{DD}$) of the sense amplifier unit;
   (b) a first amplifier stage comprising feedback NMOS transistors and serving for voltage level shifting and for amplifying the data signal present on the bit lines;
   (c) and having a second amplifier stage for amplifying further the signal output by the first amplifier stage,
   (d) in which case the first amplifier stage can be initialized to the supply voltage potential ($V_{DD}$) and the second amplifier stage can be initialized to ground potential ($V_{SS}$).

2. The memory sense amplifier unit as claimed in claim 1, wherein the precharge circuit switches the supply voltage potential ($V_{DD}$) through directly, without a voltage drop, to the bit lines, in a manner dependent on a first operating mode control signal.

3. The memory sense amplifier unit as claimed in claim 1, wherein the first amplifier stage shifts the voltage potential present on the bit lines by a constant voltage.

4. The memory sense amplifier unit as claimed in claim 1, wherein the first amplifier stage comprises four NMOS transistors which have feedback via feedback lines.

5. The memory sense amplifier unit as claimed in claim 1, wherein the second amplifier stage is a symmetrically constructed differential amplifier stage, comprising two PMOS transistors and two NMOS transistors.

6. The memory sense amplifier unit as claimed in claim 1, wherein the memory sense amplifier unit can be changed over between a precharge operating mode, a writing operating mode and a reading operating mode by two operating mode control signals.

7. The memory sense amplifier unit as claimed in claim 6, wherein in the precharge operating mode, the memory sense amplifier unit is initialized for a subsequent read/write operation.

8. The memory sense amplifier unit as claimed in claim 1, wherein the second amplifier stage can be connected to ground by means of an NMOS transistor, the NMOS transistor being controlled by the second operating mode control signal.

9. The memory sense amplifier unit as claimed in claim 1, wherein the first amplifier stage is connected, on the output side, to the gate terminals of the two PMOS transistors of the second amplifier stage.

10. The memory sense amplifier unit as claimed in claim 9, wherein the gate terminals of the two PMOS transistors of the second amplifier stage can be connected to a reference potential by means of pull-down MOSFET transistors, the pull-down MOSFET transistors being driven by the inverted second operating mode control signal $\overline{RE}$.

11. The memory sense amplifier unit as claimed in claim 1, wherein the supply voltage ($V_{DD}$) can be connected to the first amplifier stage by means of a PMOS transistor, which can be driven by the inverted second operating mode control signal $\overline{RE}$.

12. The memory sense amplifier unit as claimed in claim 1, wherein the memory send amplifier unit is constructed using CMOS technology.

* * * * *